United States Patent
Mandal

(10) Patent No.: US 9,270,293 B2
(45) Date of Patent: Feb. 23, 2016

(54) SYSTEM AND METHOD FOR MULTI CHANNEL SAMPLING SAR ADC

(71) Applicant: TEXAS INSTRUMENTS INCORPORATED, Dallas, TX (US)

(72) Inventor: Dipankar Mandal, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/529,785

(22) Filed: Oct. 31, 2014

(65) Prior Publication Data

US 2015/0372691 A1    Dec. 24, 2015

Related U.S. Application Data

(60) Provisional application No. 62/013,634, filed on Jun. 18, 2014.

(51) Int. Cl.
    H03M 1/00    (2006.01)
    H03M 1/38    (2006.01)
    H03M 1/12    (2006.01)

(52) U.S. Cl.
    CPC ............... *H03M 1/38* (2013.01); *H03M 1/001* (2013.01); *H03M 1/1245* (2013.01)

(58) Field of Classification Search
    CPC ..... H03M 1/1245; H03M 1/001; H03M 1/12; H03M 1/38; H03M 1/468; H03M 1/46; H03M 1/124

USPC .................. 341/155, 163, 110, 141, 158, 162
See application file for complete search history.

(56) References Cited

U.S. PATENT DOCUMENTS

| | | | | |
|---|---|---|---|---|
| 5,638,072 A * | 6/1997 | Van Auken | ........... | H03M 1/804 341/141 |
| 7,379,012 B2 * | 5/2008 | Sutardja | ................ | H03M 1/682 341/155 |
| 8,284,093 B2 * | 10/2012 | Kawai | ................ | H03M 1/0845 341/155 |
| 8,717,221 B2 * | 5/2014 | Jeon | .................... | H03M 1/0678 341/163 |
| 2002/0008654 A1 * | 1/2002 | Sakakibara | ......... | H03M 1/1225 341/162 |
| 2006/0187106 A1 * | 8/2006 | Mitra | .................... | H03M 1/004 341/155 |
| 2011/0133963 A1 * | 6/2011 | Kawai | ................ | H03M 1/0845 341/110 |
| 2013/0265181 A1 * | 10/2013 | Haneda | .................... | H03M 1/12 341/110 |
| 2014/0085122 A1 * | 3/2014 | Jeon | .................... | H03M 1/0678 341/158 |

* cited by examiner

*Primary Examiner* — Jean B Jeanglaude
(74) *Attorney, Agent, or Firm* — Gregory J. Albin; Frank D. Cimino

(57) ABSTRACT

A device includes a SAR, a comparator, a DAC and a multi-channel passive S/H component. The multichannel passive S/H component is able to sample and hold a plurality of analog voltages in parallel. The multichannel passive S/H component is further able to serially feed the plurality of sampled and held analog voltages to the SAR, comparator and DAC, such that each analog voltage is serially converted to a digital representation.

20 Claims, 12 Drawing Sheets

SYSTEM AND METHOD FOR MULTI CHANNEL SAMPLING SAR ADC

The present application claims priority from: U.S. Provisional Application No. 62/013,634 filed Jun. 18, 2014, the entire disclosure of which is incorporated herein by reference.

BACKGROUND

The present invention is generally drawn to and analog-to-digital converters (ADCs) that employ successive approximation registers (SARs).

A SAR is a type of ADC that converts a continuous analog waveform into a discrete digital representation via a binary search through all possible quantization levels before finally converging upon a digital output for each conversion. An example conventional ADC will now be described with reference to FIGS. 1A-C.

FIGS. 1A-1C illustrate a conventional ADC 100. FIG. 1A illustrates ADC 100 estimating an input voltage using a most significant bit, whereas the FIG. 1B illustrates ADC 100 estimating the input voltage using the next most significant bit, and whereas FIG. 1C illustrates ADC 100 estimating the input voltage using the least significant bit.

As shown in FIG. 1A, ADC 100 includes a sample and hold (S/H) component 102, a comparator 104, a SAR 106 and a digital-to-analog converter (DAC).

S/H component 102 is arranged to receive on analog input voltage, $V_{in}$, from an input line 110 and is arranged to output a sampled and held analog voltage, $V_x$, onto an output line 112. S/H component 102 samples and holds $V_{in}$ until it is need.

Comparator 104 is arranged to receive $V_x$ from output line 112 at a first input and to receive and output voltage, $V_{out}$, from DAC 108 from an output line 114 at a second input. Comparator 104 is also arranged to output a compared signal, based on a comparison of $V_x$ and $V_{out}$, to a line 116.

SAR 106 is arranged to receive the compared signal from line 116 and to receive a clock signal from a clock line 118. SAR 106 is arranged to output SAR output values to output lines 120, 122 and 124 to ultimately provide a digital representation of an approximation of $V_{in}$.

DAC 108 is arranged to receive a reference voltage, $V_{ref}$, via a reference line 111. DAC 108 provides $V_{out}$ based on $V_{ref}$ and the SAR output values from SAR 106.

In operation, conventional ADC 100 provides a digital output corresponding to an analog input. For purposes of discussion, let $V_{in}$ be 3.7 V. Initially, SAR 106 starts with the most significant bit and asks "is it greater than 4 V?" A digital value of "1" is output to output line 120, a digital value of "0" is output to output line 122 and a digital value of "0" is output to output line 124, DAC 108. In this example, let $V_{ref}$ be 1 V, such that $V_{out}$ is in 1 V increments associated with the digital value provided by SAR 106. Accordingly, DAC 108 outputs $V_{out}$ as an analog value of 4 V to comparator 104 via output line 114.

Comparator 104 compares the 4 V from DAC 108 and the 3.7 V provided by S/H component 102, and indicates that $V_{in}$ "is not greater than 4 V," thus outputting a digital "0" to SAR 106.

As shown in FIG. 1B, SAR 106 then resets the most significant bit to "0" and sets the next bit to a digital "1," and asks "is it greater than 2 V?" A digital value of "0" is output to output line 120, a digital value of "1" is output to output line 122 and a digital value of "0" is output to output line 124, DAC 108.

DAC 108 then outputs $V_{out}$ as an analog value of 2 V to comparator 104 via output line 114.

Comparator 104 compares the 2 V from DAC 108 and the 3.7 V provided by S/H component 102, and indicates that $V_{in}$ "is greater than 4 V," thus outputting a digital "1" to SAR 106.

As shown in FIG. 1C, SAR 106 then sets the next bit to a digital "1," and asks "is it greater than 3 V?" A digital value of "0" is output to output line 120, a digital value of "1" is output to output line 122 and a digital value of "1" is output to output line 124, DAC 108.

DAC 108 then outputs $V_{out}$ as an analog value of 3 V to comparator 104 via output line 114.

Comparator 104 compares the 3 V from DAC 108 and the 3.7 V provided by S/H component 102, and indicates that $V_{in}$ "is greater than 3 V," thus outputting a digital "1" to SAR 106.

At this point, it is determined that $V_{in}$ is less than 4 V but greater than 3 V. As such SAR 106 has gone through all bits and reached an end to the conversion, so the digital representation of the analog $V_{in}$ is output as "001" on output lines 120, 122 and 124.

In some applications, analog voltages on a plurality of input lines, or multichannel inputs, may need to be converted to digital signals. Conventionally, multichannel ADCs may be used for such conversions. Some example conventional multichannel ADCs will now be described with reference to FIGS. 2-3.

In one type of conventional multichannel ADC, multiple SAR ADCs are used to simultaneously sample and convert analog voltages, in parallel. These converted signals are then provided to a central processing portion for serial output. This will be described with reference to FIG. 2.

FIG. 2 illustrates an example conventional multichannel ADC 200.

As shown in the figure, conventional multichannel ADC 200 includes a SAR ADC 202, a SAR ADC 204, a SAR ADC 206 a SAR ADC 208 and a controller component 210.

SAR ADC 202 is arranged to receive an analog input voltage, $V_{in1}$, from an input line 212 and is arranged to output a digital output voltage, $V_{o1}$, onto an output line 214. SAR ADC 204 is arranged to receive an analog input voltage, $V_{in2}$, from an input line 216 and is arranged to output a digital output voltage, $V_{o2}$, onto an output line 218. SAR ADC 206 is arranged to receive an analog input voltage, $V_{in3}$, from an input line 220 and is arranged to output a digital output voltage, $V_{o3}$, onto an output line 222. SAR ADC 208 is arranged to receive an analog input voltage, $V_{in4}$, from an input line 224 and is arranged to output a digital output voltage, $V_{o4}$, onto an output line 226.

Controller component 210 is arranged to receive $V_{o1}$ from output line 214, to receive $V_{o2}$ from output line 218, to receive $V_{o3}$ from output line 222, to receive $V_{o4}$ from output line 226 and to output a digital output voltage, $V_{out}$, onto an output line 228.

In operation, conventional multichannel ADC 200 receives $V_{in1}$, $V_{in2}$, $V_{in3}$ and $V_{in4}$ in parallel. Each analog input voltage is converted to a respective digital representation in parallel. Controller 210 then outputs digital voltages serially.

A problem multichannel ADC 200 is that the plural SAR ADC require much power and use a large amount of circuit real estate. Further, there is a higher channel to channel mismatch due to the presence of separate ADCs on each channel In another type of conventional multichannel ADC, multiple S/H components are used to simultaneously sample analog voltages. These sampled signals are then provided to a PGA before being serially converted. This will be described with reference to FIG. 3.

FIG. 3 illustrates another example conventional multichannel ADC 300.

As shown in the figure, ADC 300 includes ADC 100 of FIG. 1 in addition to an S/H component 302, an S/H component 304, an S/H component 306, an S/H component 308 and a programmable gain amplifier (PGA) or an active sample and hold amplifier (SHA) 310.

S/H component 302 is arranged to receive an analog input voltage, $V_{in1}$, from an input line 312 and is arranged to output a sampled and held analog voltage, $V_{s1}$, onto an output line 314. S/H component 304 is arranged to receive an analog input voltage, $V_{in2}$, from an input line 316 and is arranged to output a sampled and held analog voltage, $V_{s2}$, onto an output line 318. S/H component 306 is arranged to receive an analog input voltage, $V_{in3}$, from an input line 320 and is arranged to output a sampled and held analog voltage, $V_{s3}$, onto an output line 322. S/H component 308 is arranged to receive an analog input voltage, $V_{in4}$, from an input line 324 and is arranged to output a sampled and held analog voltage, $V_{s4}$, onto an output line 326.

PGA 310 is arranged to receive $V_{in1}$ from output line 112, $V_{in2}$ from output line 318, $V_{in3}$ from output line 322 and $V_{in4}$ from output line 322. PGA 310 is additionally arranged to output an analog voltage as $V_{in}$ onto line 110.

In operation, conventional multichannel ADC 300 samples and holds $V_{in1}$, $V_{in2}$, $V_{in3}$ and $V_{in4}$ in parallel with S/H component 302, S/H component 304, S/H component 306 and S/H component 308. To ensure that the sampled voltage is accurately converted, the entire voltage stored in any one of S/H components 302, 304, 306 and 308 must be transferred to S/H component 102. To ensure that the sampled voltage is entirely transferred, PGA 310 is provided.

Each analog input voltage is provided to PGA 310, which outputs amplified versions of the analog input voltages serially. Comparator 104, SAR 106 and DAC 108 then serially converts each amplified signal to digital representation in a manner similar to that discussed above with reference to FIGS. 1A-C.

A problem multichannel ADC 300 is that PGA or SHA requires much power and use a large amount of circuit real estate. Being active circuits, both the PGA and the SHA introduce more noise and other non-idealities of their own into the circuit, which leads to higher error in the precision circuit.

What is needed is a passive multi-channel ADC that uses a single SAR ADC that does not require multiple DACs (or ADC) or does not require any PGA or any SHA.

BRIEF SUMMARY

The present invention provides a passive multi-channel ADC that uses a single SAR ADC that does not require multiple DACs (or ADC) or does not require any PGA or any SHA.

Aspects of the present invention are drawn to a device that includes a SAR, a comparator, a DAC, a reference voltage line, a first input line, a second input line, a conversion line and a passive S/H component. The SAR generates first successive approximation instructions and second successive approximation instructions. The comparator provides a compared output to the SAR. The DAC is connected to the comparator and can receive the first successive approximation instructions and can receive the second successive approximation instructions. The reference voltage line provides a reference voltage. The first input line provides a first analog input voltage. The second input line provides a second analog input voltage. The conversion line is connected to the DAC and to the comparator. The passive S/H component receives the reference voltage from the reference voltage line, samples and holds the first analog input voltage from the first input line during a first time period, samples and holds the second analog input voltage from the second input line during the first time period, outputs the sampled and held first analog input voltage to the conversion line to the DAC at a second time period, and outputs the sampled and held second analog input voltage to the conversion line to the DAC at a third time period. The DAC and the comparator convert the sampled and held first analog input voltage to a first digital representation to a during the second time period based on the first successive approximation instructions. The DAC and the comparator convert the sampled and held second analog input voltage to a second digital representation during the third time period based on the second successive approximation instructions.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIGS. 1A-1C illustrate a conventional ADC, wherein FIG. 1A illustrates the ADC estimating an input voltage using a most significant bit, whereas the FIG. 1B illustrates the ADC estimating the input voltage using the next most significant bit, and whereas FIG. 1C illustrates the ADC estimating the input voltage using the least significant bit;

FIG. 2 illustrates an example conventional multichannel ADC;

DETAILED DESCRIPTION

The present invention is drawn to a multichannel ADC that includes a passive multichannel S/H component. The passive multichannel S/H component is "passive" in that it does not include any amplifiers. By using a passive component, less power is consumed in operation and much less circuit area is required.

A multichannel ADC in accordance with aspects of the present invention is able eliminate amplifiers associated with the S/H components because a multichannel ADC in accordance with aspects of the present invention does not transfer the entire voltage that is sampled and held by a S/H component to the comparator. On the contrarily, in a multichannel ADC in accordance with aspects of the present invention, the charge associated with a sampled voltage is shared between the capacitor in the S/H component and the capacitors in the DAC. As a result of the charge sharing, no amplifiers are required and space is saved.

The multichannel ADC in accordance with aspects of the present invention samples the multiple channels in parallel and then serially converts each sampled and held analog voltage with a single SAR and a single DAC. By using a single SAR and a single DAC, much less circuit area is required over conventional systems that use plural SAR DACs.

Example embodiments of the present invention will now be further described with reference to FIGS. 4-12.

Figure 4:
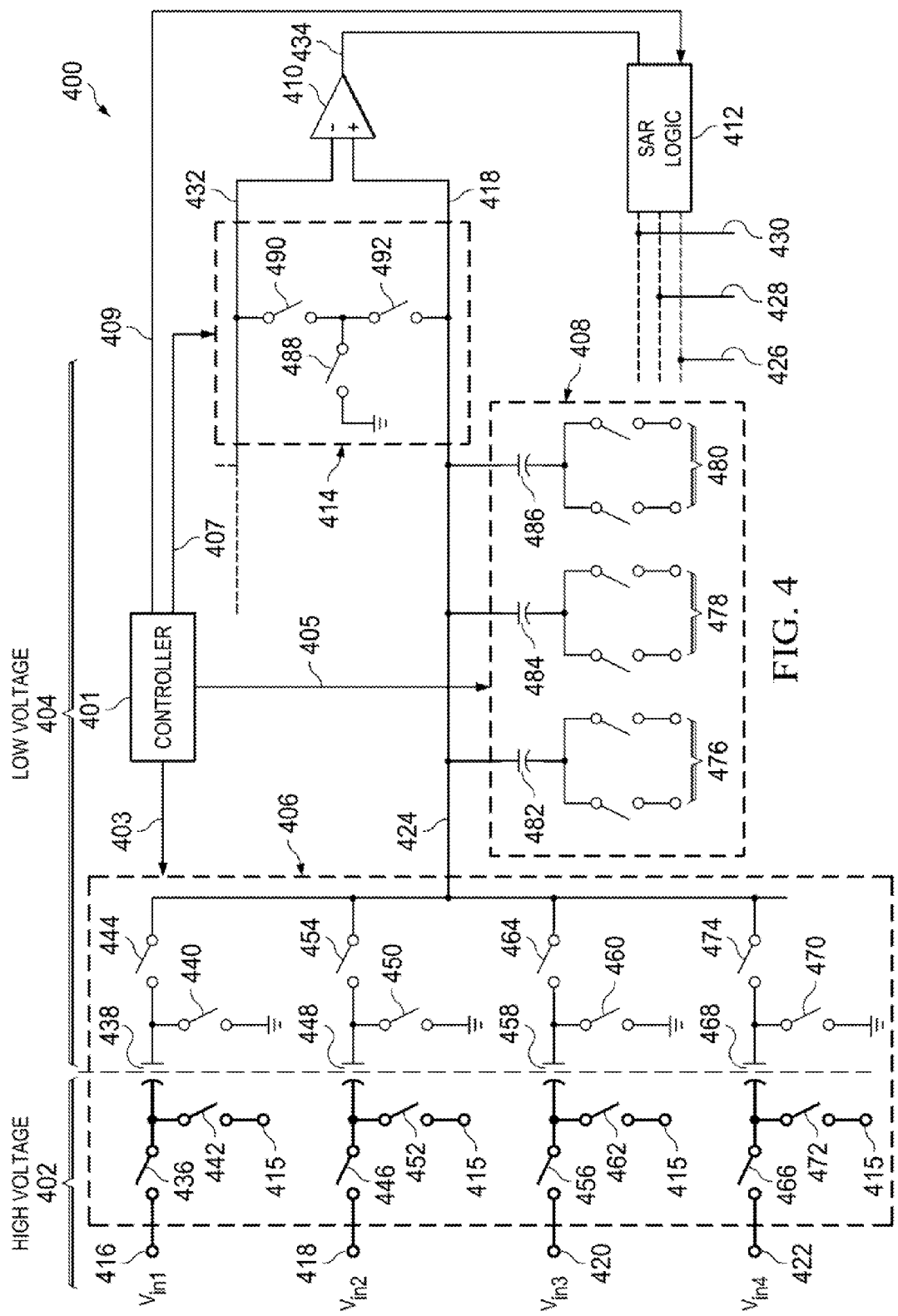
FIG. 4 illustrates an example multichannel ADC, in accordance with aspects of the present invention.

FIG. 4 illustrates an example multichannel ADC 400, in accordance with aspects of the present invention.

As shown in the figure, multichannel ADC 400 includes controller 401, a passive S/H component 406, a DAC 408, a comparator 410, a SAR 412 and a reset switching component 414.

In this embodiment, each of controller 401, passive S/H component 406, DAC 408, comparator 410, SAR 412 and reset switching component 414 are illustrated as distinct component. However, in other embodiments, at least two of controller 401, passive S/H component 406, DAC 408, comparator 410, SAR 412 and reset switching component 414 may be combined as a unitary device.

Controller 401 is arranged to output S/H controlling signals on a control line 403, to output DAC controlling signals on a control line 405, to output reset controlling signals on a control line 407, and to output SAR controlling signals on a control line 409.

Passive S/H component 406 is arranged to receive a reference voltage, $V_{ref}$, from a reference voltage line 415. Passive S/H component 406 is additionally arranged: to receive an analog input voltage, $V_{in1}$, from an input line 416; to receive an analog input voltage, $V_{in2}$, from an input line 418; to receive an analog input voltage, $V_{in3}$, from an input line 420; and to receive an analog input voltage, $V_{in4}$, from an input line 422. Passive S/H component 406 is additionally arranged to receive S/H controlling signals from control line 403. Passive S/H component 406 is additionally arranged to output onto a conversion line 424.

Controller 401 controls the state of the switches within S/H component 406 via the S/H controlling signals. Controller 401 controls the state of the switches within DAC 408 via the DAC controlling signals. Controller 401 controls the state of the switches within reset switching component 414 via the reset controlling signals. Controller 401 controls SAR 412 via the SAR controlling signals.

Passive S/H component 406 receives, in parallel, a plurality of analog voltages. The received analog voltages are sampled and held, in parallel, and are then serially released as needed for conversion.

Figure 1B:
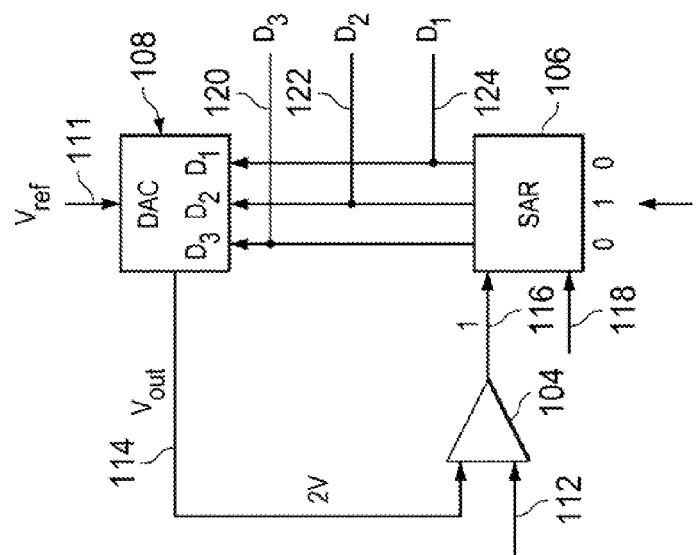
Figure 1A:
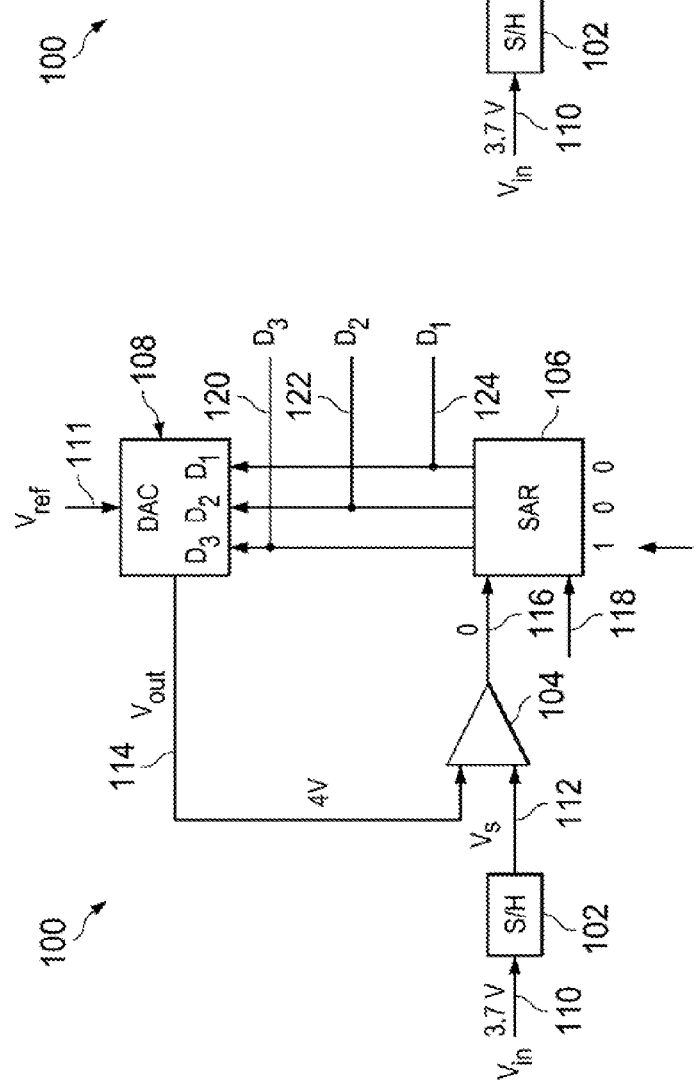
Figures 1C, 2:
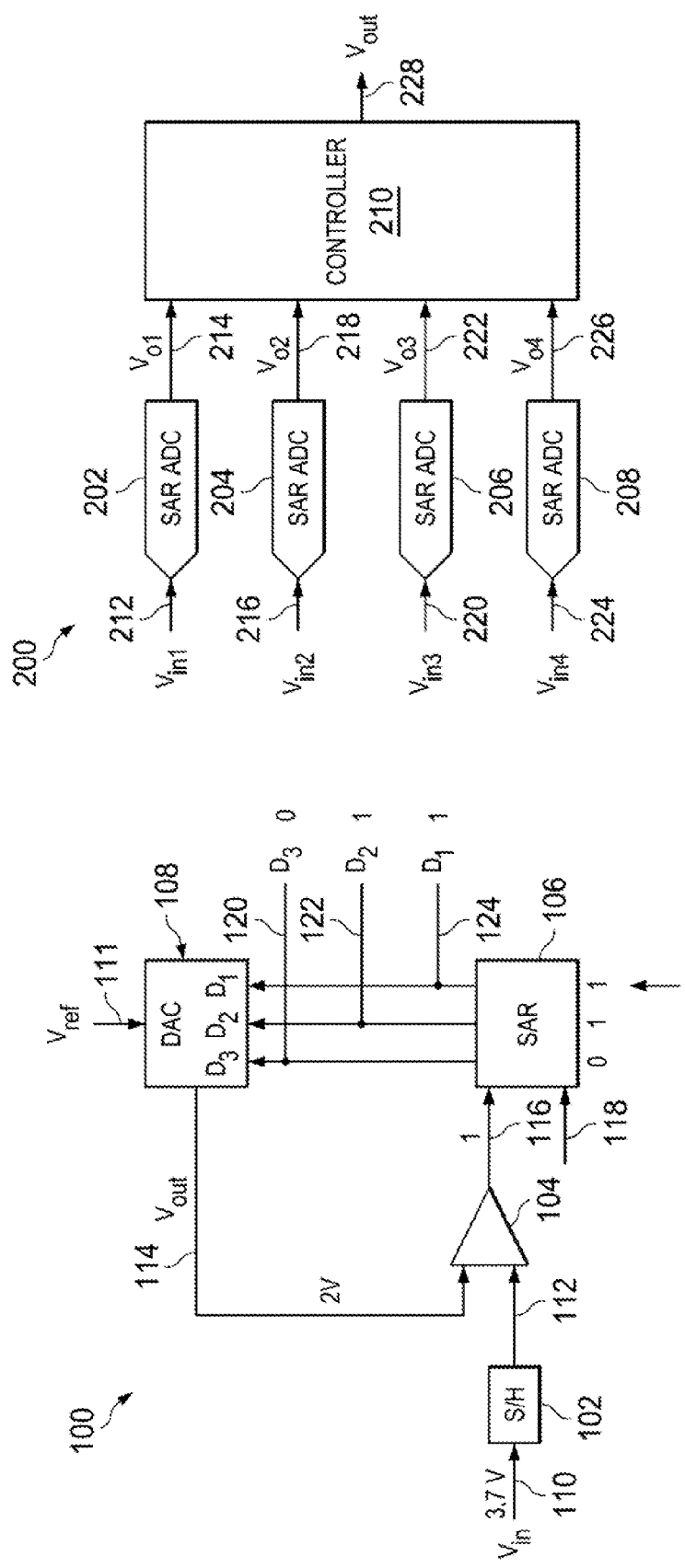
Figure 3:
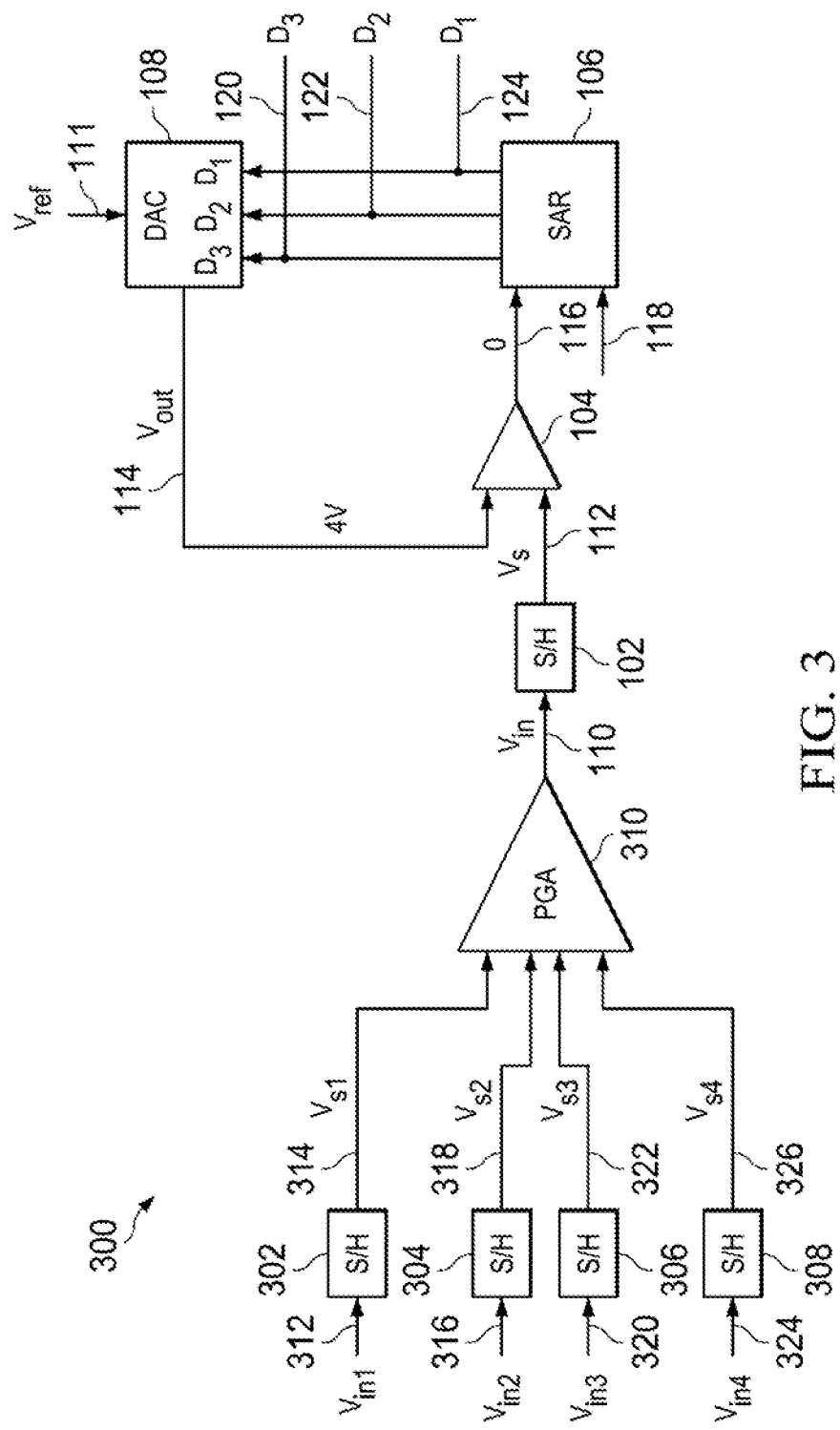
FIG. 3 illustrates another example conventional multichannel ADC.

DAC 408 is arranged to receive successive approximation instructions from SAR 412 via instruction lines 426, 428 and 430. DAC 408 is additionally arranged to receive DAC controlling signals from control line 405. DAC 408 is arranged to output digital values to comparator 410 via conversion line 424. DAC 408 provides an analog output voltage corresponding to a digital representation as provided by SAR 412, in a manner similar to DAC 108 discussed above with reference to FIGS. 1A-C. In particular, in multichannel ADC 400, passive S/H component 406 and DAC 408 provide their respective outputs to the same input of comparator 410, whereas the other input to comparator 410 is grounded. Such an arrangement is similar in function to an arrangement where the output of passive S/H component 406 is provided to one input of comparator 410 and the output of DAC 408 is provided to the other input of comparator 410.

Comparator 410 is arranged to receive input from conversion line 424, to receive an input from a line 432, and to output a compared value to SAR 412 via a line 434. Comparator 410 determines whether a sampled analog voltage as provided by S/H component 406 is greater than an analog voltage as provided by DAC 408, in a manner similar to comparator 104 discussed above with reference to FIGS. 1A-C.

SAR 412 provides successive approximation instructions to DAC 408, in a manner similar to comparator SAR 106 discussed above with reference to FIGS. 1A-C.

DAC 408, comparator 410 and SAR 412 provide digital representations to each sampled analog voltage as provided by S/H component 406 in a manner similar to DAC 108, comparator 104 and SAR 106 discussed above with reference to FIGS. 1A-C.

Passive S/H component 406 includes a sampling switch 436, a capacitor 438 and a sample switch 440. Sample switch 436 is disposed between input line 416 and capacitor 438. Sampling switch 440 is disposed between capacitor 438 and ground. In some embodiments, ground may be replaced by a predetermined reference voltage.

Passive S/H component 406 further includes a conversion switch 442 and a conversion switch 444. Conversion switch 442 is disposed between reference voltage line 415 and capacitor 438. Conversion switch 444 is disposed between capacitor 438 and conversion line 424.

Passive S/H component 406 further includes a sampling switch 446, a capacitor 448 and a sampling switch 450. Sampling switch 446 is disposed between input line 418 and capacitor 448. Sampling switch 450 is disposed between capacitor 448 and ground. Again, in some embodiments, ground may be replaced by a predetermined reference voltage.

Passive S/H component 406 further includes a conversion switch 452 and a conversion switch 454. Conversion switch 452 is disposed between reference voltage line 415 and capacitor 448. Conversion switch 454 is disposed between capacitor 448 and conversion line 424.

Passive S/H component 406 further includes a sampling switch 456, a capacitor 458 and a sampling switch 460. Sampling switch 456 is disposed between input line 420 and capacitor 458. Sampling switch 460 is disposed between capacitor 458 and ground. Again, in some embodiments, ground may be replaced by a predetermined reference voltage.

Passive S/H component 406 further includes a conversion switch 462 and a conversion switch 464. Conversion switch 462 is disposed between reference voltage line 415 and capacitor 458. Conversion switch 464 is disposed between capacitor 458 and conversion line 424.

Passive S/H component 406 further includes a sampling switch 466, a capacitor 468 and a sampling switch 470. Sampling switch 466 is disposed between input line 422 and capacitor 468. Sampling switch 470 is disposed between capacitor 468 and ground. Again, in some embodiments, ground may be replaced by a predetermined reference voltage.

Passive S/H component 406 further includes a conversion switch 472 and a conversion switch 474. Conversion switch 472 is disposed between reference voltage line 415 and capacitor 468. Conversion switch 474 is disposed between capacitor 468 and conversion line 424.

DAC 408 includes an input portion 476, an input portion 478, an input portion 480, a capacitor 482, a capacitor 484 and a capacitor 486. Capacitor 482 is disposed between input portion 476 and conversion line 424. Capacitor 484 is disposed between input portion 478 and conversion line 424. Capacitor 486 is disposed between input portion 480 and conversion line 424. Input portion 476 is arranged to receive successive approximation instructions from SAR 412 via instruction line 426. Input portion 478 is arranged to receive successive approximation instructions from SAR 412 via instruction line 428. Input portion 480 is arranged to receive successive approximation instructions from SAR 412 via instruction line 430.

Reset switching component 414 includes a reset switch 488, a reset switch 490 and a reset switch 492. Reset switch 488 is disposed between ground and both reset switch 490 and reset switch 492. Reset switch 490 is disposed between line 432 and reset switch 488. Reset switch 492 is disposed between conversion line 424 and reset switch 488.

Operation of multichannel ADC 400 will now be described with reference to FIGS. 5-12.

Figure 5:
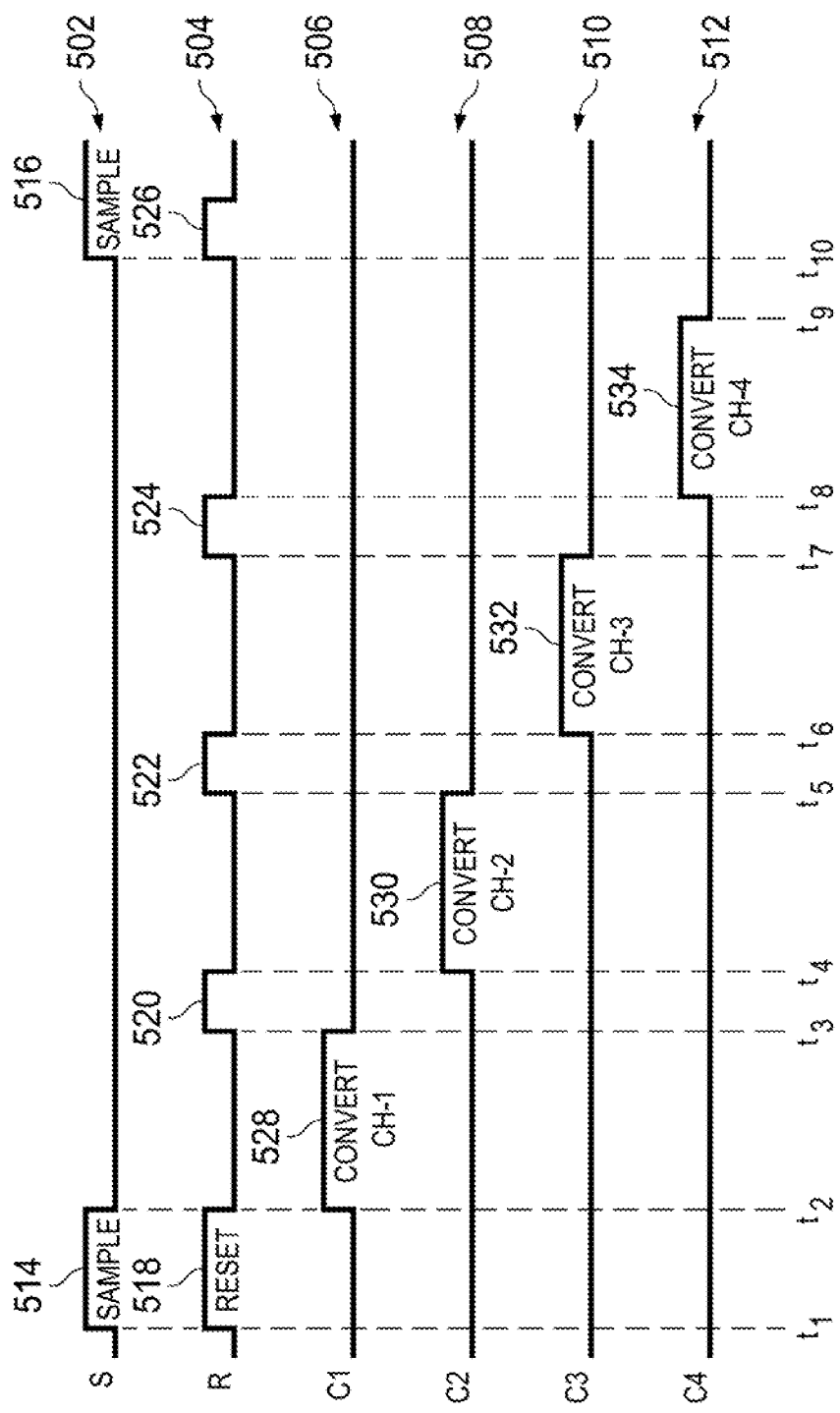
FIG. 5 illustrates a timing diagram for multiple states of operation of the multichannel ADC of FIG. 4.

FIG. 5 illustrates a timing diagram for multiple states of operation of multichannel ADC 400.

FIG. 5 includes a sample function 502, a reset function 504, a first channel conversion function 506, a second channel conversion function 508, a third channel conversion function 510 and a fourth channel conversion function 510.

Sample function 502 includes a sample pulse 514 and a sample pulse 516. Sample pulse 514 is disposed from a time $t_1$ through a time $t_2$. Sample pulse 516 is disposed after a time $t_{10}$.

Reset function 504 includes a reset pulse 518, a reset pulse 520, a reset pulse 522, a reset pulse 524 and a reset pulse 526. Reset pulse 518 is disposed from time $t_1$ through a time $t_2$, reset pulse 520 is disposed from a time $t_3$ through a time $t_4$, reset pulse 522 is disposed from a time $t_5$ through a time $t_6$, reset pulse 524 is disposed from a time $t_7$ through a time $t_8$ and reset pulse 526 is disposed from time $t_{10}$.

First channel conversion function 506 includes a conversion pulse 528 disposed from time $t_2$ through time $t_3$. Second channel conversion function 508 includes a conversion pulse 530 disposed from time $t_4$ through time $t_5$. Third channel conversion function 510 includes a conversion pulse 532 disposed from time $t_6$ through time $t_7$. Fourth channel conversion function 512 includes a conversion pulse 534 disposed from time $t_8$ through a time $t_9$.

In operation, the analog voltages are sampled in a parallel and DAC 408 is reset. This is described in FIG. 5, wherein at time $t_1$, sample pulse 514 of sample function 502 starts and reset pulse 518 of reset function 504 starts. This will be further described with reference to FIG. 6.

Figure 6:
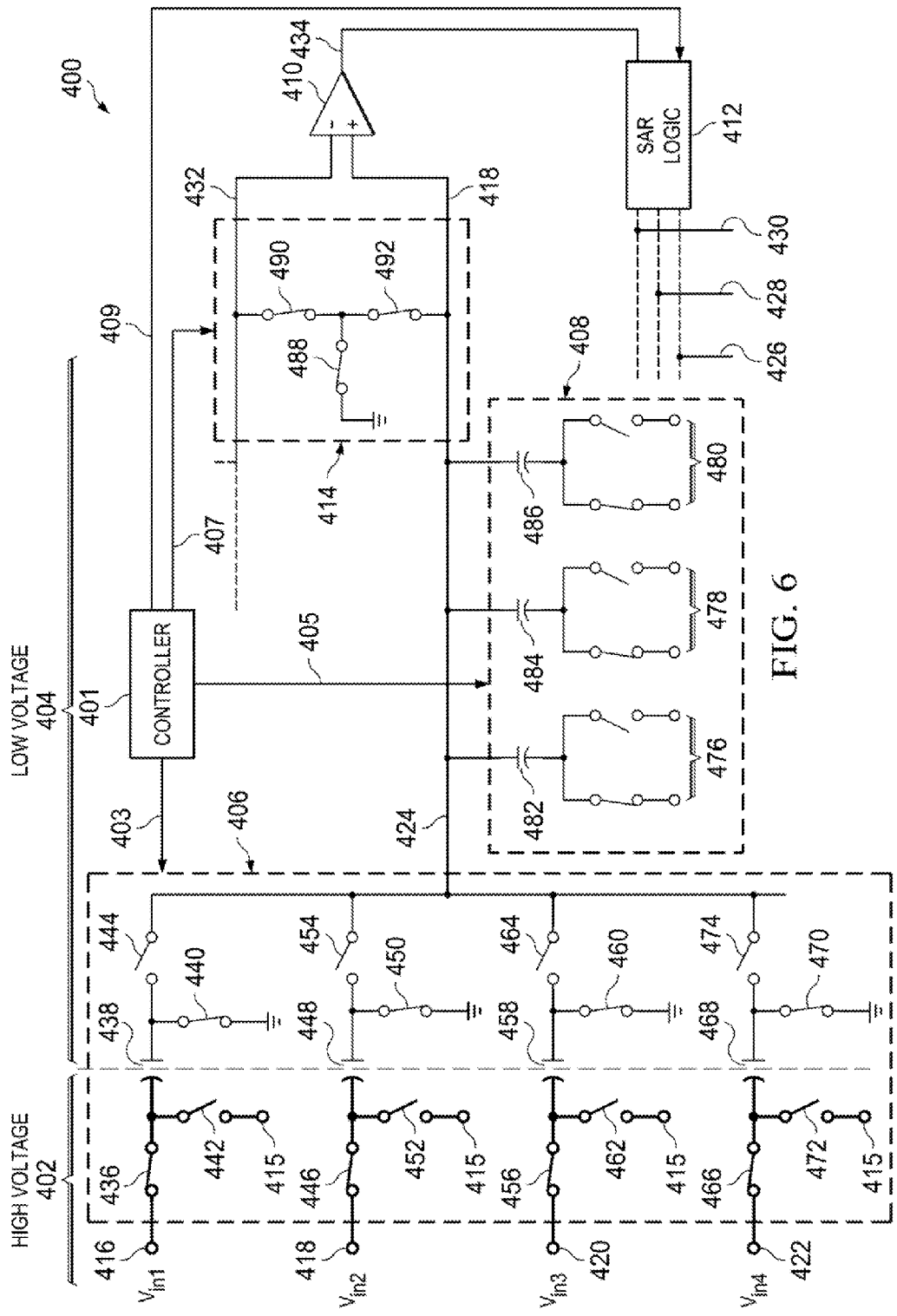
FIG. 6 illustrates the multichannel ADC of FIG. 4 in a parallel sampling state.

FIG. 6 illustrates multichannel ADC 400 in a parallel sampling state.

As shown in the figure, in passive S/H component 406, sampling switch 436 and sampling switch 440 are closed. In particular, controller 401 outputs S/H controlling signals to S/H component 406 so as to close sampling switch 436 and sampling switch 440, and so as to open conversion switch 442 and conversion switch 444. Accordingly, $V_{in1}$ on input line 416 charges capacitor 438.

Similarly: sampling switch 446 and sampling switch 450 are closed, so $V_{in2}$ on input line 418 charges capacitor 448; sampling switch 456 and sampling switch 460 are closed, so $V_{in3}$ on input line 420 charges capacitor 458; and sampling switch 466 and sampling switch 470 are closed, so $V_{in4}$ on input line 422 charges capacitor 468. In particular, the S/H controlling signals close sampling switches 446, 450, 456, 460, 466 and 470 and open conversion switches 452, 454, 462, 464, 472 and 474.

Further, in reset switching component 414, reset switch 488, reset switch 490 and reset switch 492 are closed, so capacitors 482, 484, and 486 of DAC 408 are discharged to ground. In particular, controller 401 outputs reset controlling signals to reset switching component 414 so as to close reset switch 488, reset switch 490 and reset switch 492.

Still further, in DAC 408, one of the switches in each of input portions 476, 478 and 480 are closed. In this manner, any charge stored in capacitors 482, 484 and 486 may be discharged to ground via conversion line 424, reset switch 492 and reset switch 488.

At this point, DAC 408 has been reset and all the analog voltages have been sampled in parallel.

Now that the analog voltages have been sampled in a parallel and DAC 408 has been reset, the first sampled and held analog voltage is converted to a digital representation. This is described in FIG. 5, wherein at time $t_2$, conversion pulse 528, of first channel conversion function 506, starts. This will be further described with reference to FIG. 7.

Figure 7:
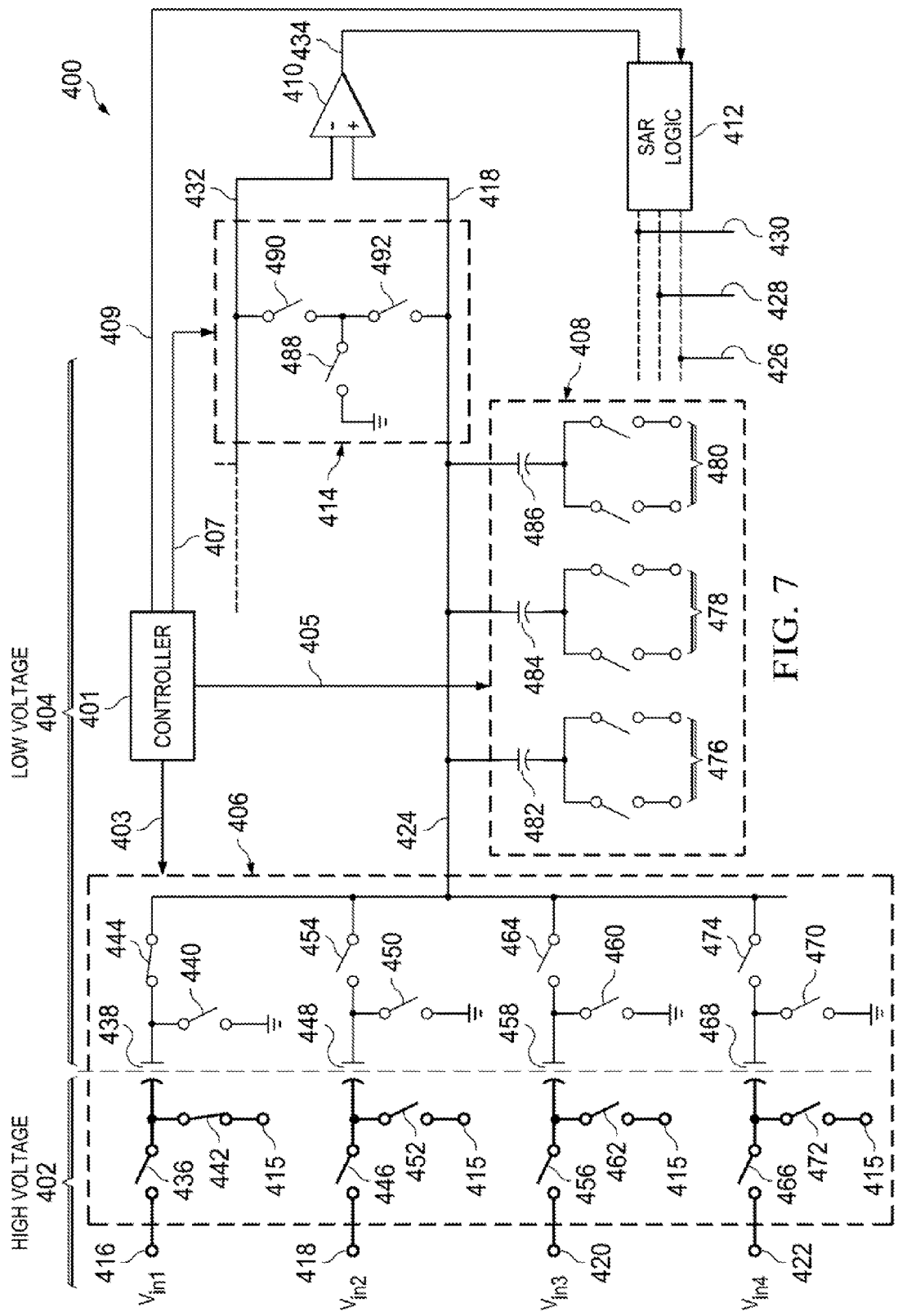
FIG. 7 illustrates the multichannel ADC of FIG. 4 in a state of conversion of the analog voltage sampled in a first channel.

FIG. 7 illustrates multichannel ADC 400 in a state of conversion of the analog voltage sampled in the first channel.

As shown in the figure, in passive S/H component 406, sampling switch 436, sampling switch 440, sampling switch 446, sampling switch 450, sampling switch 456, sampling switch 460, sampling switch 466 and sampling switch 470 have been opened, whereas conversion switch 442 and conversion switch 444 are closed. In particular, controller 401 outputs S/H controlling signals S/H component 406 to so as to close conversion switch 442 and conversion switch 444 and so as to open the remaining switches in S/H component 406.

Accordingly, $V_{in1}$ that has been previously sampled and held on capacitor 438 is output to DAC 408 and comparator 410 via conversion line 424. On the other hand, $V_{in2}$ is still held on capacitor 448, $V_{in3}$ is still held on capacitor 458 and $V_{in4}$ is still held on capacitor 468.

Further, controller 401 outputs new reset controlling signals to reset switching component 414 so as to open reset switch 488, reset switch 490 and reset switch 492, to prevent capacitors 482, 484, and 486 of DAC 408 from discharging to ground.

During this state controller 401 outputs new DAC controlling signals and SAR controlling signals such that the sampled and held analog voltage associated with $V_{in1}$, will be converted to a digital representation via DAC 408, comparator 410 and SAR 412. At the end of the conversion, the digital representation of $V_{in1}$ will be output as digital values on instruction lines 426, 428 and 430.

An important aspect of the invention is drawn to the sharing of the charge, of the sampled signal, between the S/H component and the DAC. Here, a charge stored in capacitor 438 is shared with capacitors 482, 484 and 486 of DAC 408.

The charge, Q, stored in a capacitor having a capacitance, C, is related to the voltage, V, applied to the capacitor as follows:

$$Q=CV. \quad (1)$$

When capacitors are arranged in a parallel, their capacitances are added. For purposes of discussion, let the capacitances of each of capacitors 482, 484 and 486 be equal. As capacitors 482, 484 and 486 are arranged in parallel with respect to conversion line 424 and comparator 410, the capacitance, $C_{DAC}$, of DAC 408 will be the sum of the capacitances of capacitors 482, 484 and 486. As capacitor 438 is arranged in parallel with capacitors 482, 484 and 486 with respect to conversion line 424 and comparator 410, the total capacitance, $C_T$, will be the sum of $C_{DAC}$ and the capacitance, $C_{438}$, of capacitor 438.

Now, let $C_{438}$ be equal to the $C_{DAC}$. Rewriting equation (1) yields:

$$Q=2C_{438}V. \quad (2)$$

Now, after being reset, DAC 408 has zero voltage. As such, by sharing the charge between DAC 408 and capacitor 438, the new voltage in capacitor 438 will be:

$$Q/(2C_{438})=V/2. \quad (3)$$

In other words, because of the charge sharing, the voltage on line 424, to comparator 410 is attenuated. The amount of attenuation is related to the proportional relationship between the total capacitance of DAC 408 and the capacitance of capacitor 438. In the example where $C_{438}$ be equal to the $C_{DAC}$, the voltage on line 424, to comparator 410 is V/2.

As mentioned above, in the conventional systems with reference to FIGS. 1A-C and 3, for conversion, the entire charge stored in the sampling capacitor is transferred to the comparator. Because the entire charge is transferred, an active device such as an amplifier must be used to transfer the charge from the sampling capacitor to the comparator. On the contrary, in accordance with aspects of the present invention, the charge stored in the sampling capacitor is shared with the DAC. As a result of the charge sharing, there is no need for an active device between the sampling capacitor and the comparator.

Now that the conversion of $V_{in1}$ is complete, DAC 408 is reset. This is described in FIG. 5, wherein at time $t_3$, reset pulse 520 of reset function 504 starts. This will be further described with reference to FIG. 8.

Figure 8:
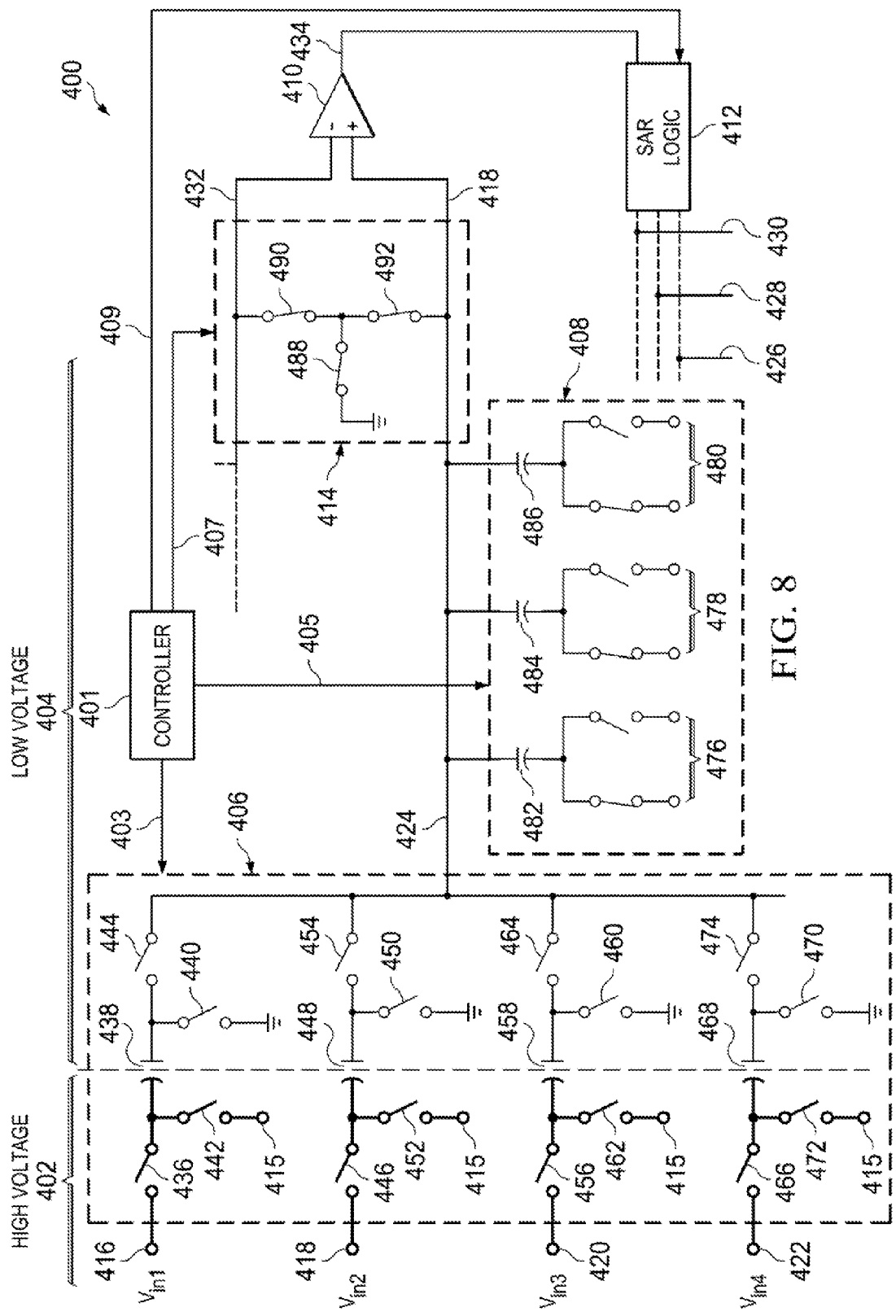
FIG. 8 illustrates multichannel ADC 400 in a resetting state.

FIG. 8 illustrates multichannel ADC 400 in a resetting state.

Controller 401 outputs new reset controlling signals to reset switching component 414, such that reset switch 488, reset switch 490 and reset switch 492 are closed, to reset DAC 408 by discharging capacitors 482, 484, and 486 to ground. Further, controller 401 outputs new S/H controlling signals to passive S/H component 406 such that conversion switch 442 and conversion switch 444 are reopened, so as not to be connected to ground when reset switch 488, reset switch 490 and reset switch 492 are closed.

Still further, in DAC 408, one of the switches in each of input portions 476, 478 and 480 are closed. In this manner, any charge stored in capacitors 482, 484 and 486 may be discharged to ground via conversion line 424, reset switch 492 and reset switch 488. At this point, DAC 408 has been reset.

Now that DAC 408 has again been reset, the second sampled and held analog voltage is converted to a digital representation. This is described in FIG. 5, wherein at time $t_4$, conversion pulse 530, of second channel conversion function 508, starts. This will be further described with reference to FIG. 9.

Figure 9:
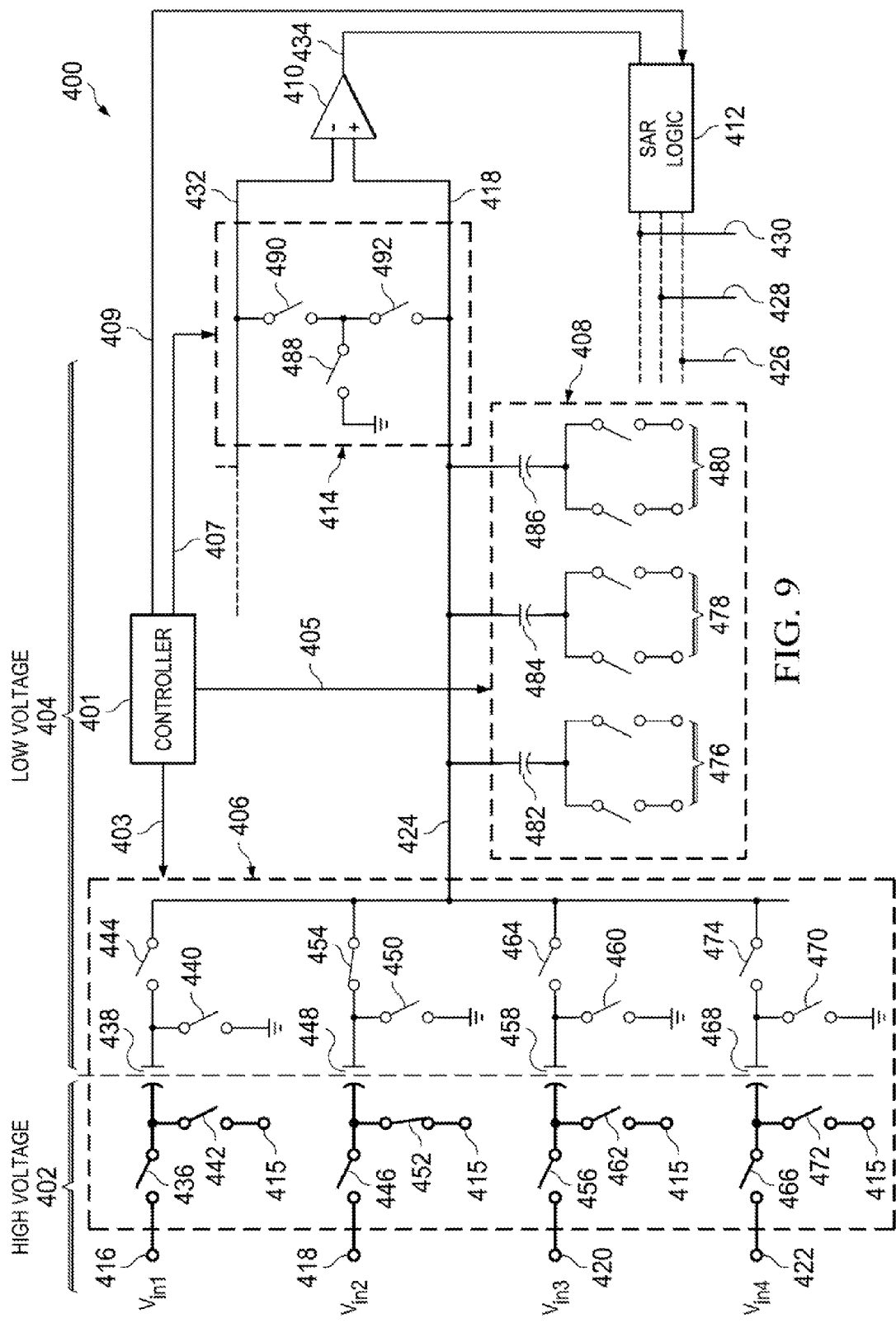
FIG. 9 illustrates the multichannel ADC of FIG. 4 in a state of conversion of the analog voltage sampled in a second channel.

FIG. 9 illustrates multichannel ADC 400 in a state of conversion of the analog voltage sampled in the second channel.

Controller 401 outputs new S/H controlling signals to passive component 406 so as to close conversion switch 452 and conversion switch 454. Accordingly, $V_{in2}$ that has been previously sampled and held on capacitor 448 is output to DAC 408 and comparator 410 via conversion line 424. On the other hand, $V_{in3}$ is still held on capacitor 458 and $V_{in4}$ is still held on capacitor 468.

Further, controller 401 outputs new reset controlling signals to reset switching component 414 to open reset switch 488, reset switch 490 and reset switch 492, to prevent capacitors 482, 484, and 486 of DAC 408 from discharging to ground.

During this state controller 401 additionally outputs new DAC controlling signals and SAR controlling signals such that the sampled and held analog voltage associated with $V_{in2}$ will be converted to a digital representation via DAC 408, comparator 410 and SAR 412. At the end of the conversion, the digital representation of $V_{in2}$ will be output as digital values on instruction lines 426, 428 and 430.

Now that the conversion of $V_{in2}$ is complete, DAC 408 is again reset. This is described in FIG. 5, wherein at time $t_5$, reset pulse 522 of reset function 504 starts. This resetting state is that same as that describe above with reference to FIG. 8.

Now that DAC 408 has again been reset, the third sampled and held analog voltage is converted to a digital representation. This is described in FIG. 5, wherein at time $t_6$, conversion pulse 532, of third channel conversion function 510, starts. This will be further described with reference to FIG. 10.

Figure 10:
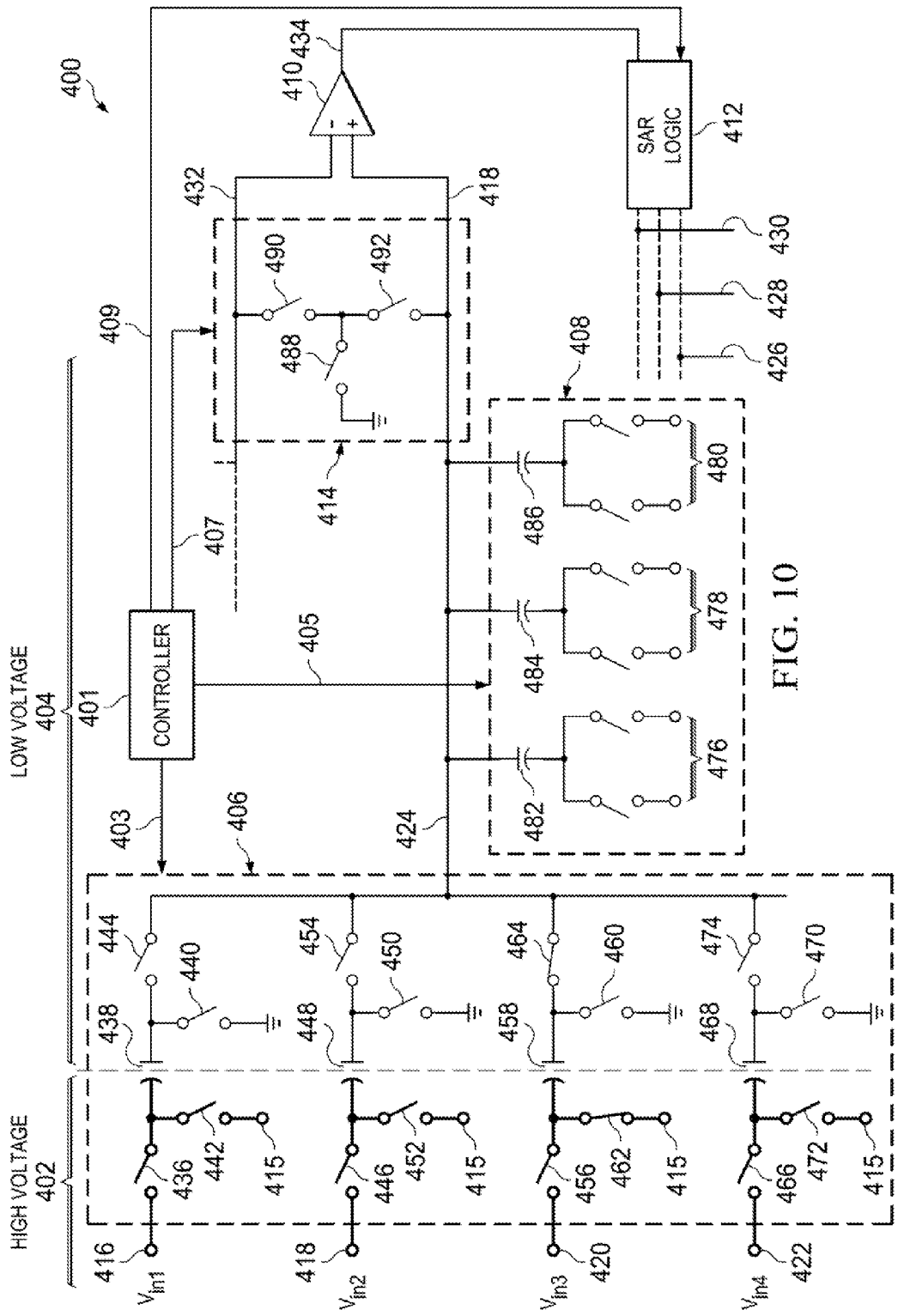
FIG. 10 illustrates the multichannel ADC of FIG. 4 in a state of conversion of the analog voltage sampled in a third channel.

FIG. 10 illustrates multichannel ADC 400 in a state conversion of the analog voltage sampled in the third channel.

Controller 401 outputs new S/H controlling signals to passive S/H component 406 to close conversion switch 462 and conversion switch 464. Accordingly, $V_{in3}$ that has been previously sampled and held on capacitor 458 is output to DAC 408 and comparator 410 via conversion line 424. On the other hand, $V_{in4}$ is still held on capacitor 468.

Further, controller 401 outputs new reset controlling signals to reset switching component 414 to open reset switch 488, reset switch 490 and reset switch 492, to prevent capacitors 482, 484, and 486 of DAC 408 from discharging to ground.

During this state, controller 401 additionally outputs new DAC controlling signals and SAR controlling signals such that the sampled and held analog voltage associated with $V_{in3}$ will be converted to a digital representation via DAC 408, comparator 410 and SAR 412. At the end of the conversion, the digital representation of $V_{in3}$ will be output as digital values on instruction lines 426, 428 and 430.

Now that the conversion of $V_{in3}$ is complete, DAC 408 is again reset. This is described in FIG. 5, wherein at time $t_7$, reset pulse 524 of reset function 504 starts. This resetting state is that same as that describe above with reference to FIG. 8.

Now that DAC 408 has again been reset, the fourth sampled and held analog voltage is converted to a digital representation. This is described in FIG. 5, wherein at time $t_8$, conversion pulse 534, of fourth channel conversion function 512, starts. This will be further described with reference to FIG. 11.

Figure 11:
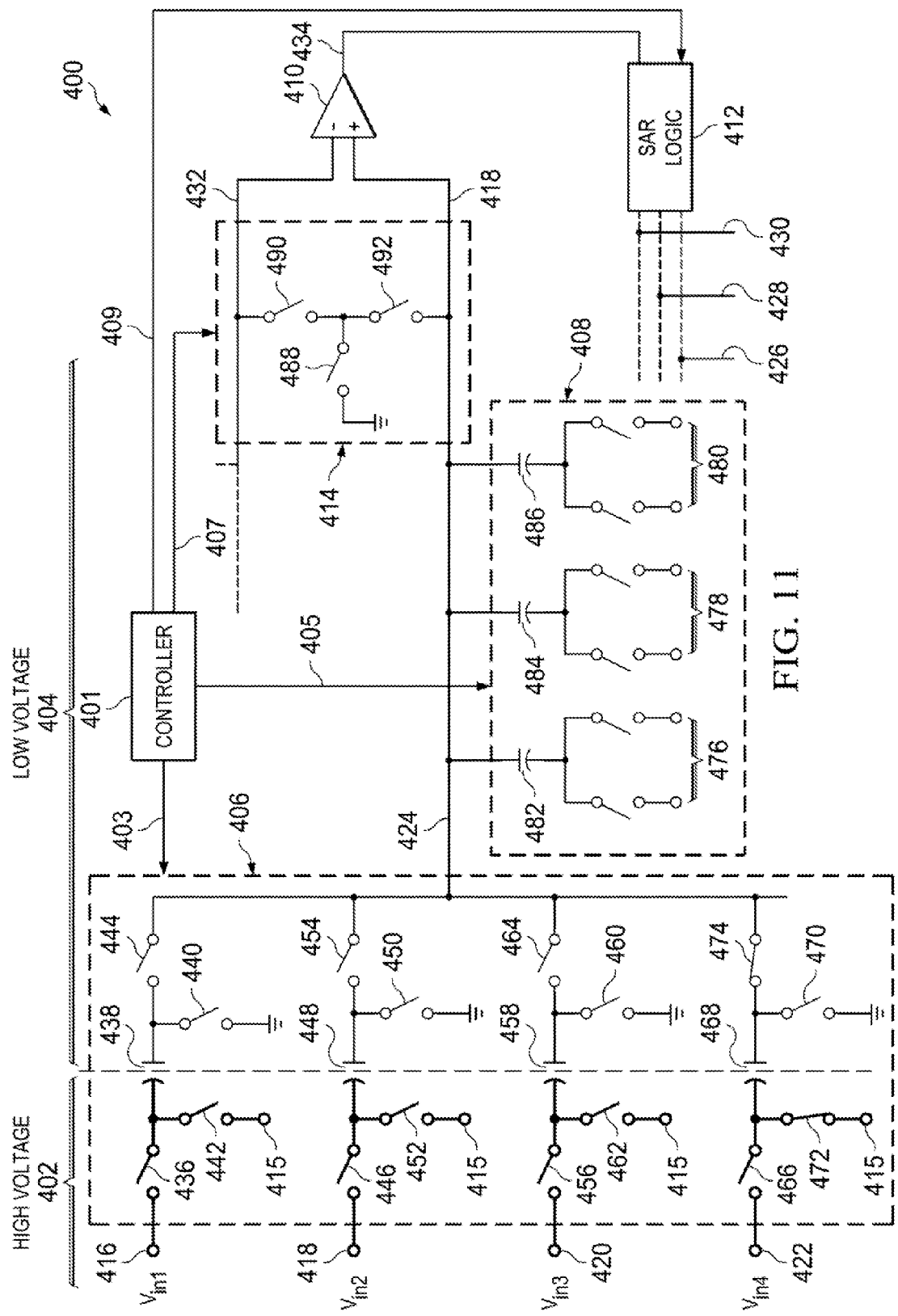
FIG. 11 illustrates the multichannel ADC of FIG. 4 in a state of conversion of the analog voltage sampled in a fourth channel.

FIG. 11 illustrates multichannel ADC 400 in a state of conversion of the analog voltage sampled in the fourth channel.

Controller 401 outputs new S/H controlling signals to passive S/H component 406 such that conversion switch 472 and conversion switch 474 are closed. Accordingly, $V_{in4}$ that has been previously sampled and held on capacitor 468 is output to DAC 408 and comparator 410 via conversion line 424.

Further, controller 401 outputs new reset controlling signals to in reset switching component 414 to open reset switch 488, reset switch 490 and reset switch 492, to prevent capacitors 482, 484, and 486 of DAC 408 from discharging to ground.

During this state, controller 401 additionally outputs new DAC controlling signals and SAR controlling signals such that the sampled and held analog voltage associated with $V_{in4}$, will be converted to a digital representation via DAC 408, comparator 410 and SAR 412. At the end of the conversion, the digital representation of $V_{in4}$ will be output as digital values on instruction lines 426, 428 and 430.

Now that the conversion of $V_{in4}$ is complete, the analog voltages on all the channels are again samples, DAC 408 is again reset, and the process repeats. This is described in FIG. 5, wherein at time $t_{10}$, sample pulse 516 of sample function 502 starts and reset pulse 526 of reset function 504 starts.

As shown in the example embodiment described above with reference to FIGS. 4-11, a passive S/H component is operable to sample multiple channels of analog voltages and is able serially convert the multiple sampled voltages using a single SAR and a single DAC. In the example embodiment four channels are sampled. However, this is merely a non-limiting example provided for purposes of discussion. It should be known that a multichannel ADC in accordance with aspects of the present invention may be designed for use with an any number, N, of channels.

As discussed above with reference to FIGS. 2-3, conventional multichannel ADC use a scaling SHA when a single ADC is used for conversion, or use multiple ADCs for each separate channel. With a multichannel ADC in accordance with aspects of the present invention, a SHA and PGA, or any active element that will store the sampled charge on a different channel and subsequently and serially drive the ADC, is eliminated and direct charge sharing is done with a sampling capacitor and conversion capacitor. This reduces the power and area required for the SHA in conventional systems.

Furthermore, some conventional multichannel ADCs, the capacitor in conversion DAC itself is used as a sampling capacitor, which requires high voltage switch at bottom plate of conversion DAC. High voltage switches add higher parasitic capacitances, causing the conversion to be slow. On the other hand, with a multichannel ADC in accordance with aspects of the present invention, the sampling path and conversion path are separated to have faster conversion time. This reduces the conversion time.

In accordance with another aspect of the present invention, the value of the sampling capacitor may be in a different ratio with respect to the conversion capacitor to provide different attenuation ratios of the high voltage input. Further, the DAC can be reset to an appropriate voltage before the start of any conversion so that the common mode voltage of the corresponding input does not introduce error in conversion. In other words, the DAC conversion range is set equal to the input range. This helps to support different input voltage ranges, both bipolar, e.g., +/−10 V, +/−5 V, etc., and unipolar, e.g., 0-10 V, 0-5 V, etc. This will be further described with reference to FIG. 12.

Figure 12:
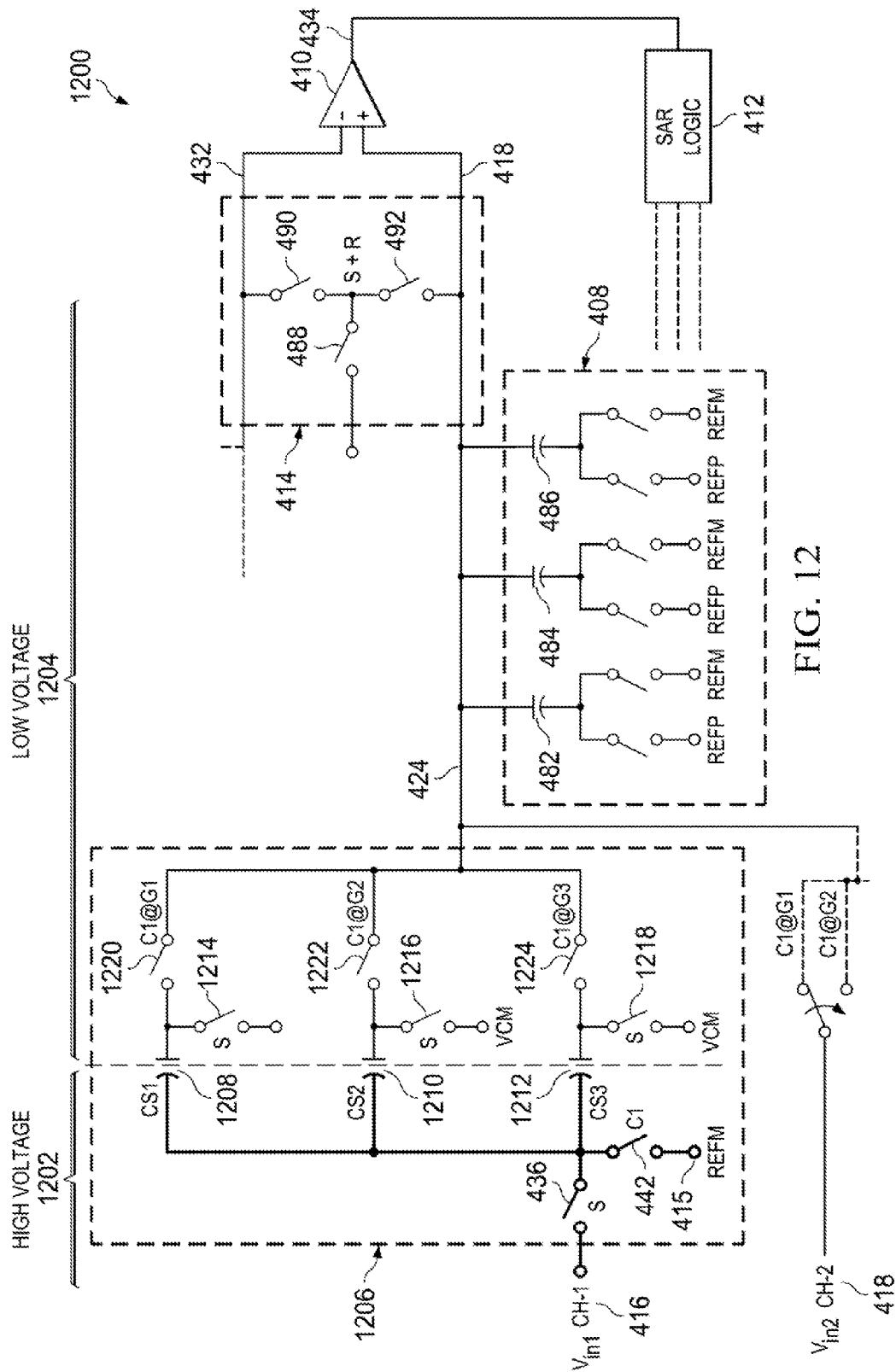
FIG. 12 illustrates another example multichannel ADC, where input dynamic range can be programmed differently for each channel, in accordance with aspects of the present invention.

FIG. 12 illustrates another example multichannel ADC 1200, where input dynamic range can be programmed differently for each channel, in accordance with aspects of the present invention.

As shown in the figure, multichannel ADC 1200 has a high voltage side indicated by dotted double arrow 1202 and a low voltage side indicated by dotted double arrow 1204. Multichannel ADC 1200 is similar to multichannel ADC 400 of FIG. 4, bit differs in that input line 416 of passive S/H component 406 is modified to provide multiple optional gain outputs. In particular, ADC 1200 further includes a capacitor 1208, a capacitor 1210 and a capacitor 1212, all arranged in a parallel. Further, each of capacitor 1208, capacitor 1210 and capacitor 1212 has an associated sampling switch 1214, 1216 and 1218, respectively. Still further, each of capacitor 1208, capacitor 1210 and capacitor 1212 has an associated conversion switch 1220, 1222 and 1224, respectively.

In operation, when $V_{in1}$ is sampled during the sampling state, controller 401 (not shown) outputs new S/H controlling signals to close sampling switch 436, sampling switch 1214, sampling switch 1216 and sampling switch 1218, and to open conversion switches 1220, 1222 and 1224. Accordingly, $V_{in1}$ on input line 416 charges capacitors 1208, 1210 and 1212.

When the first channel is then converted, controller 401 (not shown) outputs new S/H controlling signals to close conversion switches 1220, 1222 and 1224, and to open sampling switch 436, sampling switch 1214, sampling switch 1216 and sampling switch 1218. During this state, a new version of the sampled and held analog voltage associated with $V_{in1}$ will be converted to a digital representation via DAC 408, comparator 410 and SAR 412. Specifically, the sampled and held analog voltage associated with $V_{in1}$, as stored in all three of capacitors 1208, 1210 and 1212, will be converted to a digital representation via DAC 408, comparator 410 and SAR 412. Accordingly the analog voltage being converted is actually a $V_{in1}*G$, wherein G is the gain associated with capacitors 1208, 1210 and 1212. At the end of the conversion, the digital representation of $V_{in1}*G$ will be output as digital values on instruction lines 426, 428 and 430.

Conventional multichannel simultaneous sampling SAR ADCs use multiple SAR ADCs for parallel conversion of data or multiple sample and hold amplifiers (SHAs) for serial conversion. In the case of multiple SAR ADCs, each channel includes a SAR ADC, which provides the simultaneous sampling and parallel conversion of data for that corresponding channel. In the case of multiple SHAs, all the SHAs sample the input simultaneously and the data is converted serially on a single ADC or in parallel on multiple SAR ADC.

A multichannel ADC in accordance with aspects of the present invention enable a low power, low area simultaneous sampling of multichannel high voltages, by way of a passive multichannel S/H component and single SAR.

In an example embodiment, a sampling capacitor is separated from a conversion capacitor in the S/H component. N separate sampling capacitors may be used to support a simultaneously sampling N-channel ADC. Each sampling capacitor can be connected to the DAC through a conversion switch. The sampling capacitors sample the input analog voltages simultaneously and then serially connect to the DAC for each conversion. As such, in the sampling time is $T_{smpl}$ and the conversion time for each channel is $T_{conv}$, the for an N-channel ADC, the frame time is equal to $T_{smpl}+N*T_{conv}$.

A benefit of a multichannel ADC in accordance with aspects of the present invention is that the sampling capacitor and the capacitors in the DAC share the charge among themselves and complete the conversion. Accordingly, no SHA is required to transfer the sampled charge to the DAC. Further for high voltage input (e.g., +/−10 V), high voltage switches are used only at the bottom plate of the sampling capacitor. All the bottom plate switches of the DAC are low voltage switches, which helps to run the conversion faster.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A device comprising:
a successive approximation register operable to generate first successive approximation instructions and second successive approximation instructions;
a comparator operable to provide a compared output to said successive approximation register;
a digital to analog converter connected to said comparator and operable to receive the first successive approximation instructions and to receive the second successive approximation instructions;
a reference voltage line operable to provide a reference voltage;
a first input line operable to provide a first analog input voltage;
a second input line operable to provide a second analog input voltage;
a conversion line connected to said digital to analog converter and to said comparator; and
a passive sample-and-hold component operable to receive the reference voltage from said reference voltage line, to sample and hold the first analog input voltage from said first input line during a first time period, to sample and hold the second analog input voltage from said second input line during the first time period, to output the sampled and held first analog input voltage to said conversion line to said digital to analog converter at a second time period, and to output the sampled and held second analog input voltage to said conversion line to said digital to analog converter at a third time period;
wherein said digital to analog converter and said comparator are operable to convert the sampled and held first analog input voltage to a first digital representation during the second time period based on the first successive approximation instructions,
wherein said digital to analog converter and said comparator are further operable to convert the sampled and held second analog input voltage to a second digital representation during the third time period based on the second successive approximation instructions, and
wherein said passive sample-and-hold component and said digital to analog converter are operable to share a charge associated with the first analog input voltage.

2. The device of claim 1,
wherein said passive sample-and-hold component comprises a first conversion switch, a first capacitor, a second conversion switch and a second capacitor,
wherein said first conversion switch is disposed between said first input line and said conversion line,
wherein said first capacitor is disposed between said first conversion switch and said first input line,
wherein said second conversion switch is disposed between said second input line and said conversion line,
wherein said second capacitor is disposed between said second conversion switch and said second input line,
wherein said first conversion switch is operable to close during the second time period so as to output the sampled and held first analog input voltage to said digital to analog converter, and
wherein said second conversion switch is operable to close during the third time period so as to output the sampled and held second analog input voltage to said digital to analog converter.

3. The device of claim 2, further comprising:
a reset switching component operable to reset said digital to analog converter during a fourth period,
wherein the fourth period is after the second time period and before the third time period.

4. The device of claim 3,
wherein said passive sample-and-hold component comprises a first sampling switch and a second sampling switch,
wherein said first sampling switch is disposed between said first input line and said first capacitor,
wherein said second sampling switch is disposed between said second input line and said second capacitor, and
wherein said first sampling switch is operable to close during the first time period so as to provide the first analog input voltage to said first capacitor, and
wherein said second sampling switch is operable to close during the first time period so as to provide the second analog input voltage to said second capacitor.

5. The device of claim 4, further comprising:
a controlling component,
wherein said passive sample-and-hold component further comprises a third conversion switch and a third capacitor,
wherein said third conversion switch is disposed between said first input line and said conversion line and in parallel with said first conversion switch,
wherein said third capacitor is disposed between said third conversion switch and said first input line and in parallel with said first capacitor,
wherein said controlling component is operable to close said third conversion switch during the second time period so as to provide a new version of the sampled and held first analog input voltage to said digital to analog converter.

6. The device of claim 1, further comprising:
a reset switching component operable to reset said digital to analog converter during a fourth period,
wherein the fourth period is after the second time period and before the third time period.

7. The device of claim 6,
wherein said passive sample-and-hold component comprises a first sampling switch and a second sampling switch,
wherein said first sampling switch is disposed between said first input line and said first capacitor,
wherein said second sampling switch is disposed between said second input line and said second capacitor, and
wherein said first sampling switch is operable to close during the first time period so as to provide the first analog input voltage to said first capacitor, and
wherein said second sampling switch is operable to close during the first time period so as to provide the second analog input voltage to said second capacitor.

8. The device of claim 7, further comprising:
a controlling component,
wherein said passive sample-and-hold component further comprises a third conversion switch and a third capacitor,
wherein said third conversion switch is disposed between said first input line and said conversion line and in parallel with said first conversion switch,
wherein said third capacitor is disposed between said third conversion switch and said first input line and in parallel with said first capacitor,
wherein said controlling component is operable to close said third conversion switch during the second time period so as to provide a new version of the sampled and held first analog input voltage to said digital to analog converter.

9. The device of claim 1,
wherein said passive sample-and-hold component comprises a first sampling switch and a second sampling switch,
wherein said first sampling switch is disposed between said first input line and said first capacitor,
wherein said second sampling switch is disposed between said second input line and said second capacitor, and
wherein said first sampling switch is operable to close during the first time period so as to provide the first analog input voltage to said first capacitor, and
wherein said second sampling switch is operable to close during the first time period so as to provide the second analog input voltage to said second capacitor.

10. The device of claim 9, further comprising:
a controlling component,
wherein said passive sample-and-hold component further comprises a third conversion switch and a third capacitor,
wherein said third conversion switch is disposed between said first input line and said conversion line and in parallel with said first conversion switch,
wherein said third capacitor is disposed between said third conversion switch and said first input line and in parallel with said first capacitor,
wherein said controlling component is operable to close said third conversion switch during the second time period so as to provide a new version of the sampled and held first analog input voltage to said digital to analog converter.

11. A method comprising:
receiving, via a passive sample-and-hold component, a reference voltage from a reference voltage line;
sampling and holding, via the passive sample-and-hold component, a first analog input voltage from a first input line during a first time period;
sampling and holding, via the passive sample-and-hold component, a second analog input voltage from a second input line during the first time period;
outputting, from the passive sample-and-hold component, the sampled and held first analog input voltage to a digital to analog converter, via a conversion line, at a second time period;
converting, via a digital to analog converter, a comparator and a successive approximation register, the sampled and held first analog input voltage to a first digital representation to a during the second time period;
outputting, from the passive sample-and-hold component, the sampled and held second analog input voltage to a digital to analog converter, via the conversion line, at a third time period; and
converting, via the digital to analog converter, the comparator and the successive approximation register, the sampled and held second analog input voltage to a second digital representation during the third time period,
wherein outputting, from the passive sample-and-hold component, the sampled and held first analog input voltage to a digital to analog converter, via a conversion line, at a second time period comprises sharing, between the passive sample-and-hold component and the digital to analog converter, a charge associated with the first analog input voltage.

12. The method of claim 11,
wherein said sampling and holding, via the passive sample-and-hold component, a first analog input voltage from a first input line during a first time period comprises storing the first analog input voltage in a first capacitor,
wherein said outputting, from the passive sample-and-hold component, the sampled and held first analog input voltage to a digital to analog converter, via a conversion line, at a second time period comprises closing a first conversion switch so as to discharge the stored first analog input voltage in the first capacitor to the conversion line,
wherein said sampling and holding, via the passive sample-and-hold component, a second analog input voltage from a second input line during the first time period comprises storing the second analog input voltage in a second capacitor,
wherein outputting, from the passive sample-and-hold component, the sampled and held second analog input voltage to the digital to analog converter, via the conversion line, at a second time period comprises closing a second conversion switch so as to discharge the stored second analog input voltage in the second capacitor to the conversion line,
wherein the first conversion switch is disposed between the first input line and the conversion line,
wherein the first capacitor is disposed between the first conversion switch and the first input line,
wherein the second conversion switch is disposed between the second input line and the conversion line, and
wherein the second capacitor is disposed between the second conversion switch and the second input line.

13. The method of claim 12, further comprising:
resetting, via a reset switching component, the digital to analog converter during a fourth period,
wherein the fourth period is after the second time period and before the third time period.

14. The method of claim 13,
wherein said sampling and holding, via the passive sample-and-hold component, a first analog input voltage from a first input line during a first time period further comprises closing a first sampling switch during the first time period so as to provide the first analog input voltage to the first capacitor,
wherein said sampling and holding, via the passive sample-and-hold component, a second analog input voltage from a second input line during the first time period further comprises closing a second sampling switch during the first time period so as to provide the second analog input voltage to the second capacitor,
wherein the first sampling switch is disposed between the first input line and the first capacitor, and
wherein the second sampling switch is disposed between the second input line and the second capacitor.

15. The method of claim 14,
wherein said sampling and holding, via the passive sample-and-hold component, a first analog input voltage from a first input line during a first time period further comprises storing the first analog input voltage in third first capacitor, wherein said outputting, from the passive sample-and-hold component, the sampled and held first analog input voltage to a digital to analog converter, via a conversion line, at a second time period further comprises instructing, via a controlling component, to close a third conversion switch so as to provide a new version of the sampled and held first analog input voltage to the digital to analog converter, wherein the third conversion switch is disposed between the first input line and the conversion line and in parallel with the first conversion switch, and wherein the third capacitor is disposed between the third conversion switch and the first input line and in parallel with the first capacitor.

16. The method of claim 11, further comprising:

resetting, via a reset switching component, the digital to analog converter during a fourth period, wherein the fourth period is after the second time period and before the third time period.

17. The method of claim 16, wherein said sampling and holding, via the passive sample-and-hold component, a first analog input voltage from a first input line during a first time period further comprises closing a first sampling switch during the first time period so as to provide the first analog input voltage to the first capacitor, wherein said sampling and holding, via the passive sample-and-hold component, a second analog input voltage from a second input line during the first time period further comprises closing a second sampling switch during the first time period so as to provide the second analog input voltage to the second capacitor, wherein the first sampling switch is disposed between the first input line and the first capacitor, and wherein the second sampling switch is disposed between the second input line and the second capacitor.

18. The method of claim 17, further comprising:

wherein said sampling and holding, via the passive sample-and-hold component, a first analog input voltage from a first input line during a first time period further comprises storing the first analog input voltage in third first capacitor, wherein said outputting, from the passive sample-and-hold component, the sampled and held first analog input voltage to a digital to analog converter, via a conversion line, at a second time period further comprises instructing, via a controlling component, to close a third conversion switch so as to provide a new version of the sampled and held first analog input voltage to the digital to analog converter, wherein the third conversion switch is disposed between the first input line and the conversion line and in parallel with the first conversion switch, and wherein the third capacitor is disposed between the third conversion switch and the first input line and in parallel with the first capacitor.

19. The method of claim 11, wherein said sampling and holding, via the passive sample-and-hold component, a first analog input voltage from a first input line during a first time period further comprises closing a first sampling switch during the first time period so as to provide the first analog input voltage to the first capacitor, wherein said sampling and holding, via the passive sample-and-hold component, a second analog input voltage from a second input line during the first time period further comprises closing a second sampling switch during the first time period so as to provide the second analog input voltage to the second capacitor, wherein the first sampling switch is disposed between the first input line and the first capacitor, and wherein the second sampling switch is disposed between the second input line and the second capacitor.

20. The method of claim 19, wherein said sampling and holding, via the passive sample-and-hold component, a first analog input voltage from a first input line during a first time period further comprises storing the first analog input voltage in third first capacitor, wherein said outputting, from the passive sample-and-hold component, the sampled and held first analog input voltage to a digital to analog converter, via a conversion line, at a second time period further comprises instructing, via a controlling component, to close a third conversion switch so as to provide a new version of the sampled and held first analog input voltage to the digital to analog converter, wherein the third conversion switch is disposed between the first input line and the conversion line and in parallel with the first conversion switch, and wherein the third capacitor is disposed between the third conversion switch and the first input line and in parallel with the first capacitor.

* * * * *